United States Patent
Wei et al.

(10) Patent No.: US 12,044,933 B2
(45) Date of Patent: Jul. 23, 2024

(54) PHOTOPATTERNING OF MOLECULAR ORIENTATIONS

(71) Applicant: Kent State University, Kent, OH (US)

(72) Inventors: Qi-Huo Wei, Hudson, OH (US); Yubing Guo, Kent, OH (US); Miao Jiang, Kent, OH (US); Oleg Lavrentovich, Kent, OH (US); Chenhui Peng, Kent, OH (US); Kai Sun, Ann Arbor, MI (US)

( * ) Notice: Subject to any disclaimer, the term of this patent is extended or adjusted under 35 U.S.C. 154(b) by 0 days.

(21) Appl. No.: 15/750,847

(22) PCT Filed: Aug. 8, 2016

(86) PCT No.: PCT/US2016/045974
§ 371 (c)(1),
(2) Date: Feb. 7, 2018

(87) PCT Pub. No.: WO2017/027444
PCT Pub. Date: Feb. 16, 2017

(65) Prior Publication Data
US 2018/0231846 A1   Aug. 16, 2018

Related U.S. Application Data

(60) Provisional application No. 62/202,426, filed on Aug. 7, 2015.

(51) Int. Cl.
*G02F 1/1337* (2006.01)
*B82Y 40/00* (2011.01)
(Continued)

(52) U.S. Cl.
CPC ...... *G02F 1/133788* (2013.01); *G02F 1/1303* (2013.01); *G03F 1/38* (2013.01); *B82Y 40/00* (2013.01); *G02F 1/133753* (2013.01)

(58) Field of Classification Search
CPC ..... G02F 1/133788; G02F 1/1303; G03F 1/38
See application file for complete search history.

(56) References Cited

U.S. PATENT DOCUMENTS

2003/0072896 A1   4/2003  Kwok et al.
2005/0128458 A1*  6/2005  Blatchford .......... G03F 7/70566
                                                355/71
(Continued)

OTHER PUBLICATIONS

Peng et al., "Liquid Crystals with Patterned Molecular Orientation as an Electrolytic Active Medium", Physical Review E 92(5), Publication (online) Oct. 2015 [retrieved on Sep. 28, 2016], Retrieved from the internet: <URL: https://www.researchgate.net/publication/282639240_Liquid_Crystals_with_Patterned_Molecular_Orientation_as_an_Eletrolytic_Active_Medium?origin=pubtication_list>: entire document.
(Continued)

*Primary Examiner* — Lauren Nguyen
(74) *Attorney, Agent, or Firm* — Lippes Mathias LLP (57) ABSTRACT

A method for aligning molecular orientations of liquid crystals and/or polymeric materials into spatially variant patterns uses metamasks. When non-polarized or circularly polarized light is transmitted through or reflected by the metamasks, spatially varied polarization direction and intensity patterns of light can be generated. By projecting the optical patterns of the metamasks onto substrates coated with photoalignment materials, spatially variant molecular orientations encoded in the polarization and intensity patterns are induced in the photoalignment materials, and transfer into the liquid crystals. Possible designs for the metamask use nanostructures of metallic materials.

20 Claims, 8 Drawing Sheets

(51) Int. Cl.
    *G02F 1/13*    (2006.01)
    *G03F 1/38*    (2012.01)

(56) References Cited

U.S. PATENT DOCUMENTS

| | | | | |
|---|---|---|---|---|
| 2009/0201475 A1* | 8/2009 | Peckerar | ............... | G03F 1/50 |
| | | | | 355/53 |
| 2013/0003033 A1* | 1/2013 | Lee | ............... | G03F 7/70475 |
| | | | | 355/67 |
| 2013/0075778 A1* | 3/2013 | Nakanishi | ........... | H01L 51/5209 |
| | | | | 257/99 |
| 2013/0083307 A1 | 4/2013 | Tseng et al. | | |
| 2013/0100431 A1 | 4/2013 | Kajiyama et al. | | |
| 2015/0192830 A1* | 7/2015 | Kajiyama | ......... | G02F 1/133788 |
| | | | | 250/492.1 |
| 2016/0187730 A1* | 6/2016 | Du | ............... | G02F 1/133711 |
| | | | | 349/124 |

OTHER PUBLICATIONS

Guo, et al. "High-Resolution and High-Throughput Plasmonic Photopatterning of Complex Molecular Orientations In Liquid Crystals", Advanced Materials; Publication [online]: Jan. 22, 2016 [retrieved on Sep. 28, 2016], Retrieved from the Internet: <URL: http://www.iop.kiev.ua/-lcff/DATA/Publ_PDF/2016/AdvMater_16.pdf>: entire document.

* cited by examiner

PHOTOPATTERNING OF MOLECULAR ORIENTATIONS

This application is a National Stage Entry of International Application No. PCT/US2016/045974, filed Aug. 8, 2016 and titled "PLASMONIC PHOTOPATTERNING OF MOLECULAR ORIENTATIONS"; and also claims the priority benefit of U.S. Provisional Application No. 62/202,426 filed Aug. 7, 2015 and titled "PLASMONIC PHOTOPATTERNING OF MOLECULAR ORIENTATIONS". Both of these applications are incorporated by reference herein in their entireties.

This invention was made with United States Government support under grant/contract number CMMI-1436565, awarded by the National Science Foundation. The United States Government has certain rights in the invention.

BACKGROUND

The present disclosure relates to methods for orienting liquid crystal molecules.

Liquid crystal materials exhibit properties between those of conventional liquids and solids. In particular, liquid crystal molecules tend to point along a common axis, called the director. In contrast, molecules in the liquid phase exhibit little or no intrinsic order and solid phase molecules exhibit little or no translational freedom.

Liquid crystal materials are widely used in various devices and applications. Typically, a liquid crystal device (e.g., a liquid crystal display) includes electrodes that form an electric field upon receiving a voltage, and a layer or layers of liquid crystal materials that are controlled by the electric field. More specifically, the dielectric anisotropy of the liquid crystal molecules makes it possible to change the orientation of the liquid crystal molecules by controlling the electric field.

Controlling molecular orientations is important to the functionalities of liquid crystal and polymeric materials and devices (e.g., gratings, tunable lenses, liquid crystal displays, stimuli-responsive liquid crystal sensors, and actuators). Thus, there is a large demand for systems and methods for aligning liquid crystal molecules in spatially varying director fields for various device manufacturing processes.

Capabilities to define spatially variant molecular orientations are needed to enable new materials and devices. Well-designed molecular orientations are needed for functional liquid crystal devices such as tunable Pancharatnam prisms and gratings, q-plates, and liquid crystalline light emitting diodes. With pre-designed director fields, the stimulus-responsive deformations of liquid crystal elastomers can be preprogrammed, enabling a variety of origami-inspired metamaterials and devices. Freedom in defining director fields also allows for engineering the nonlinear electrokinetic flows in liquid crystals that are currently obtained through the director fields induced by embedded colloidal particles. Molecular director fields can also serve as templates for directing colloidal assembly. While surface alignment of liquid crystal molecules has been a topic of extensive studies, only two techniques allow for designer, non-uniform director fields. One relies on nano-grooves created by rubbing polymer films with atomic force microscope tips or by photolithography. The other is through pixel-by-pixel direct laser writing or based on a dynamic mask exposure of photoalignment materials. These techniques are based on serial fabrication processes and thus face limitations when high resolution and scalability are considered for large-scale micro-device manufacturing.

The technique of this disclosure overcomes the limitations of these prior techniques and makes photopatterning of molecular orientations a repeatable and scalable process for manufacturing. Regarding scalability, the concepts, systems, and methods of the present disclosure may be compatible with commercial stepper systems, low cost (limitless use), and repeatable (single mask).

A traditional photomask is a plate with transparent and opaque areas. Shining light through the photomask generates intensity patterns. The photomasks are commonly used in photolithography, where the light intensity is primarily used to cause photochemical reactions in photoactive materials.

BRIEF DESCRIPTION

The metamasks of the present disclosure are a new concept of photomasks which generate not only patterns of light intensity but also patterns of polarization directions. These polarization patterns may be used to align molecular orientations in photoactive materials.

The present disclosure relates to systems and methods for aligning liquid crystal molecules with desired patterns of molecular orientations.

Disclosed, in various embodiments, are concepts, designs, and realizations of metamasks (e.g., plasmonic metamasks). When illuminated with non-polarized light, the metamasks can generate light with spatial variations in intensity and/or polarization. The light with intensity and/or polarization patterns can be generated by transmission through the metamasks, reflection from the metamasks, or a combination of transmission through and reflection from the metamasks.

Also disclosed, in various embodiments, are concepts and methods to use metamasks for aligning liquid crystal and/or polymeric materials on a substrate, or inside a liquid crystal cell, or in other situations. The substrate may include photoalignment materials coated on a solid support. The liquid crystal cell may include two plates with their inner surfaces coated with photoalignment materials. By projecting the optical patterns generated by the metamask onto photoalignment materials, alignment patterns encoded in the polarization/intensity patterns of the metamask are induced in the photoalignment layers and then imposed in the liquid crystals. The liquid crystals may be in contact with the photoalignment materials during the photo-exposure or after the photo-exposure process.

In some embodiments, the metamask includes metallic nanostructures. The metal material may include aluminum, copper, gold, or silver; or alloys thereof.

The metamask may comprise a perforated metal sheet. The perforations may be rectangular apertures and/or oval-shaped apertures.

In some embodiments, the metal sheet has a thickness in the range of from about 50 nm to about 500 nm, including from about 100 nm to about 300 nm and from about 125 nm to about 200 nm.

The apertures may have widths in the range of from about 40 nm to about 200 nm, including from about 80 nm to about 120 nm, and lengths of from about 100 nm to about 400 nm, including from about 100 nm to about 300 nm and from about 180 to about 220 nm. The aperture size may be determined by the wavelength(s) of the light used for photopatterning.

The apertures may be arranged in a triangular lattice or a square lattice.

In some embodiments, the apertures are arranged with spatially-varying orientations.

In other embodiments, the metamask comprises a metal film having nanoscale slits. As used herein, the term "nanoscale" means less than 1 μm. The slits and their separations may have dimensions less than the wavelength(s) of light provided to the metamask.

The orientations of the nanoscale slits may be varied spatially.

In other embodiments, the metamask comprises anisotropic nanoparticles. The anisotropic nanoparticles may be provided on a top surface, on a bottom surface, or dispersed within a metamask substrate. The anisotropic nanoparticles may be in the form of nanorods and/or nano-elliptic disks.

A photoalignment layer may be provided on a top surface of the substrate. The photoalignment layer may be located at a distance from the metamask of from about 0 to about 50 times a wavelength of light provided to the metamask, including from about 1 to about 10 times a wavelength of light provided to the metamask.

In other embodiments, one or more lenses are positioned between the metamask and the photoalignment layer.

Oriented/aligned substrates produced by the process described herein are also disclosed.

Further disclosed are systems and apparatuses useful for carrying out the process described herein.

These and other non-limiting characteristics are more particularly described below and in the appended materials.

BRIEF DESCRIPTION OF THE DRAWINGS

The following is a brief description of the drawings, which are presented for the purposes of illustrating the exemplary embodiments disclosed herein and not for the purposes of limiting the same.

FIG. 1a is an expanded view of a building unit made with an anisotropic aperture (such as a rectangular aperture) in a metal film. FIG. 1b is an expanded view of a building unit made with wire-grid polarizers such as parallel nanoslits. FIG. 1c is an expanded view of a building unit made with nanoparticles (such as nanorods). The building unit may have different shapes, including squares as shown here, triangles as in FIG. 4, hexagons, or other shapes that can fill the plane.

FIGS. 6a and b are SEM images of illustrative plasmonic metamasks as described in Example 4. FIG. 6c-f present optical characterizations of metamasks for defect arrays as described in Example 4. Cross-polarized optical microscope images of Example 4 are shown in FIGS. 6g and i. Pol-Scope results of Example 4 are shown in FIGS. 6h and j.

FIG. 7a illustrates patterns as described in Example 5. FIGS. 7b and c are cross-polarized optical microscope images of liquid crystal textures as described in Example 5.

FIGS. 11a and b are SEM images of plasmonic metamasks as described in Example 9. FIGS. 11c and e are transmission optical images as described in Example 9. FIGS. 11d and f illustrate the measured polarization field as described in Example 9. FIGS. 11g and I are cross-polarized optical microscope images as described in Example 9. FIGS. 11h and j show Pol-Scope of the measured molecular field as described in Example 9.

DETAILED DESCRIPTION

The present disclosure may be understood more readily by reference to the following detailed description of desired embodiments included therein and the appended article, supplementary materials, and presentation slides. In the following specification and the claims which follow, reference will be made to a number of terms which shall be defined to have the following meanings.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent can be used in practice or testing of the present disclosure. All publications, patent applications, patents, and other references mentioned herein are incorporated by reference in their entirety. The materials, methods, and articles disclosed herein are illustrative only and not intended to be limiting.

The singular forms "a," "an," and "the" include plural referents unless the context clearly dictates otherwise.

As used in the specification and in the claims, the term "comprising" may include the embodiments "consisting of" and "consisting essentially of." The terms "comprise(s),"

"include(s)," "having," "has," "can," "contain(s)," and variants thereof, as used herein, are intended to be open-ended transitional phrases that require the presence of the named ingredients/steps and permit the presence of other ingredients/steps. However, such description should be construed as also describing compositions, mixtures, or processes as "consisting of" and "consisting essentially of" the enumerated ingredients/steps, which allows the presence of only the named ingredients/steps, along with any impurities that might result therefrom, and excludes other ingredients/steps.

Unless indicated to the contrary, the numerical values in the specification should be understood to include numerical values which are the same when reduced to the same number of significant figures and numerical values which differ from the stated value by less than the experimental error of the conventional measurement technique of the type used to determine the particular value.

All ranges disclosed herein are inclusive of the recited endpoint and independently combinable (for example, the range of "from 2 to 10" is inclusive of the endpoints, 2 and 10, and all the intermediate values). The endpoints of the ranges and any values disclosed herein are not limited to the precise range or value; they are sufficiently imprecise to include values approximating these ranges and/or values.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

Light from a light source is provided to illuminate a metamask (e.g., a plasmonic metamask). The metamask is configured to generate spatially variant patterns for polarization and/or intensity. This polarized light is projected (e.g., transmitted or reflected) onto a substrate containing a material to be aligned. The substrate is coated with a photoalignment layer comprising one or more photoalignment materials. Molecular director fields encoded in the polarization patterns can be imprinted on the substrate. The concepts, systems, and methods described herein may be useful for high-resolution (e.g., ~0.5 μm) and high-throughput processing (e.g., single exposure~1 second).

The metamasks may include metallic nanostructures, and are named plasmonic metamasks in this case. In some embodiments, the plasmonic metamask comprises aluminum, an aluminum alloy, silver, a silver alloy, gold, a gold alloy, copper, a copper alloy, and/or other materials (e.g., high refractive index materials).

In some embodiments, the metamask includes nanostructure of dielectric materials. Non-limiting examples of such dielectric materials include aluminum nitride and hafnium oxide. The aluminum nitride and/or other materials may be provided on a substrate. The substrate may be transparent or substantially transparent for working wavelengths (e.g., ultraviolet or visible wavelengths). The substrate may comprise quartz, fused quartz, $SiO_2$, and/or normal glass.

In some embodiments, a band of wavelengths of light are used. Non-limiting examples of wavelength bands include from about 340 nm to about 400 nm and from about 400 nm to about 600 nm.

In some embodiments, the metamasks take advantage of the anisotropic optical response of metallic nanostructures. The anisotropic nanostructures reflect and transmit light differently for different polarization directions and yield polarization contrasts in the transmitted and/or reflected light. Non-limiting examples of metal materials include silver, gold, aluminum, copper, and alloys of one or more thereof optionally with one or more other elements.

The anisotropic nanostructures may be anisotropic apertures in metal films, as illustrated in FIG. 1a. The apertures may be rectangular or elliptical in shape. The apertures may have stronger optical transmission for the polarization direction along the short axis than along the long axis of the apertures. The apertures may be arranged in periodic or non-periodic positions. The orientations of the apertures can be arranged in spatially variant patterns from aperture to aperture, or from pixel to pixel. An individual pixel may consist of parallel nanoapertures with their orientation set by a required polarization pattern for each pixel. Polarization may be perpendicular to the long axis of the apertures.

In some embodiments, the nanoapertures are rectangular and parallel to each other.

In some embodiments, the metal sheet has a thickness in the range of from about 50 nm to about 500 nm, including from about 100 nm to about 300 nm and from about 125 nm to about 200 nm.

The nanoapertures may have a short axis width of from about 40 to about 200 nm, including from about 50 to about 150 nm, from about 75 to about 125 nm, and about 100 nm.

The nanoapertures may have a long axis length of from about 100 to about 400 nm, including from about 150 to about 290 nm, from about 170 to about 270 nm, and from about 200 to about 240 nm and about 220 nm. In some embodiments, the nanoapertures are rectangles having dimensions of about 100 nm×about 220 nm.

The nanoapertures may be arranged in a triangular lattice. In some embodiments, the lattice has a periodicity of from about 100 to about 500 nm, including from about 200 to about 400 nm, from about 250 to about 350 nm, from about 275 to about 325 nm, and about 270 nm or about 300 nm.

Figure 1:
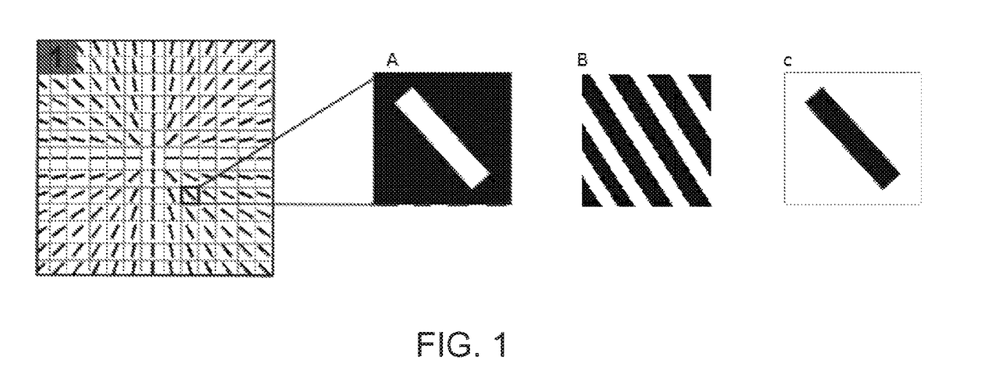
FIG. 1 illustrates metamasks for creating a spatially variant polarization pattern in accordance with some embodiments of the present disclosure.

The anisotropic nanostructures may alternatively be nanoscale slits in metal films, which are also called wire grid polarizers when the metal wire width is comparable with the slit width, as illustrated in FIG. 1. The slit width may be smaller than the wavelength(s) of light used, and the transmission of light through the nanoslits may be stronger for light polarization perpendicular to the slits than along the slits.

To generate spatially variant polarization patterns, an area of the parallel nanoslits can be used as individual units (or pixels), and placed to fill the plane. The orientations of the slits in individual units (or pixels) can be varied spatially to yield required polarization patterns. An example is illustrated in FIG. 1 for polarization with +1 defect. A plane is divided into individual building units (or pixels) of rectangles or other shapes. In each unit (or pixel), the parallel nanoslits are oriented in a direction as required by the polarization pattern for photoalignment.

The apertures may be provided in arrays with spatially variant orientations. The metamasks create spatially variant polarization patterns in the transmitted or reflected light. By projecting the transmitted or reflected light onto substrates of liquid crystal cells coated with photoalignment materials, molecular director fields encoded in the polarization patterns (i.e., the nanoaperture orientations) can be imprinted on these substrates and then imposed onto the bulk of the liquid crystal cells.

The nanoaperture arrays may have optical transmissions approaching 50% (e.g., from 30 to 50%, from 40 to 50%, from 35 to 48%, and from 40 to 45%).

Another way to generate spatially variant polarization patterns is to use anisotropic nanoparticles. Non-limiting examples of such nanoparticles include nanorods and nano-elliptic disks. For nanorods, there are two base resonant modes. Once can be excited by light with polarization along the long axis and the other can be excited by light with polarization along the short axis. These two modes are resonant at two different wavelengths. The resonant wavelengths depend on the particle sizes and dielectric constants of the substrates. For nanoparticles with their major axis parallel, the optical transmission will depend on polarization directions.

When the nanoparticles on substrates are illuminated with non-polarized light and wavelengths in the marked region, the transmitted or reflected light will be mostly polarized along one major axis of the nanoparticles. To generate complex polarization patterns, the plane can be split into individual areas (i.e., pixels). Each pixel can be filled with nanoparticles whose major axes are parallel. The nanoparticle orientations can be varied from pixel to pixel so that the polarization of light transmitted through the mask will be spatially variant.

Aluminum has a small skin depth ($\delta \sim 14$ nm) and a large surface plasmon propagation length ($\sim 3$ μm).

Non-limiting examples of photoalignment materials include azo-dyes and/or photopolymerization photoalignment materials.

In some embodiments, the photoalignment material comprises brilliant yellow (Sigma Aldrich) and/or PAAD-72 (BeamCo). These materials have absorption bands between about 400 nm and about 550 nm.

Non-limiting examples of azo-dyes include PAAD-22 (from Beamco), PAAD-27 (from Beamco), methyl red, methyl orange, SD1: 4,4'-bis(4-hydroxy-3-carboxy-phenylazo)benzidine-2,2'-disulphonic acid, and 6Az10: 1,1-[4-[(4'hexylphenyl)azo]-phenoxy]undecanoic acid.

When azo-dyes are utilized, the azo-molecules and liquid crystal molecules may be aligned with their long molecular axis perpendicular to the polarization direction of illuminating light.

Non-limiting examples of photopolymerization photoalignment materials include cinnamate, coumarin, tetrahydrophthalimide, maleimide, chalconyl, anthracenyl containing polymers, and methacrylamidoaryl methacrylates.

When photopolymerization-based photoalignment materials are used, the liquid crystal may be aligned to parallel to the polarization direction of the illuminating light.

The liquid crystals may be nematic liquid crystals, smectic liquid crystals, cholesteric liquid crystals, and/or lyotropic chromonic liquid crystal materials.

In some embodiments, the nematic liquid crystal material includes one or more of E7 (EM Industries), 4-cyano-4'-pentylbiphenyl (5CB), MLC7026 (EM Industries), a mixture of E7 and MLC7026, a mixture of 5CB and CCN47 (Nematel GmbH), CB7CB [1",7"-bis(4-cyanobiphenyl-4'-yl)heptane], and/or C7 [4,4'(1,3,4-oxadiazole-2,5-diyl) di-p-heptylbenzoate].

In some embodiments, the smectic liquid crystal material includes one or more of 8CB [4'-n-octyl-4-cyano-biphenyl] and 8OCB [octyloxybiphenyl].

In some embodiments, the cholesteric liquid crystal material includes one or more of nematic E7 doped with chiral dopant S811 [(S)-octan-2-yl 4-((4-(hexyloxy)benzoyl)oxy) benzoate] and R811 [(R)-octan-2-yl 4-((4-(hexyloxy)benzoyl)oxy)benzoate] and Nematic MLC7026 doped with chiral dopant S811 and R811.

In some embodiments, the lyotropic chromonic liquid crystal material includes one or more of disodium cromoglycate (DSCG) and sunset yellow (SSY) (e.g., in a limited period of time).

Wavelengths of light incident upon the metamasks may be determined by the absorption spectra of the photoalignment materials. In some embodiments, the wavelengths are in the range of from about 300 nm to about 550 nm. Minor adjustments may be made to the metamask designs to fit the working wavelength(s).

In some embodiments, the liquid crystal substrate has a thickness of from about 100 micrometers to a few millimeters. The photopatterning technique and the projection system may work for different thicknesses.

The photoalignment layer may be a self-assembled monolayer.

In some embodiments, the photoalignment layer has a thickness of from about 0.5 nm to about 100 nm, including from about 1 nm to about 50 nm, from about 1 to about 10 nm, from about 2 nm to about 8 nm, and from about 3 nm to about 7 nm.

In contrast to existing systems and methods using dynamic masks like digital mirror microdevices, the alignment systems and methods of the present disclosure do not have limitations of pixel numbers and may only require one time exposure. These advantages permit high throughputs and make the presently disclosed systems and methods particularly suitable for large scale manufacturing.

The systems and methods of the present disclosure may be used in a variety of applications including, but not limited to, tunable liquid crystal lenses, filters, gratings, stimuli-responsive liquid crystal devices, displays, light-emitting diodes, and photovoltaics.

The technology can be used for patterned pixel displays that would greatly improve the viewing angle performance for liquid crystal displays. If a display pixel has a uniform direction of alignment (produced by a traditional rubbing or photoalignment), the viewing angle performance is different when the observation direction changes from left to top to right to bottom view. One approach to eliminate the problem is to have the pixel divided into 2, 4 (or more) pixels with different alignment directions. The disclosed technology is particularly suitable for such an approach as the patterned photoalignment can be achieved quickly and over a large area.

The photoalignments (e.g., plasmonic photoalignments) are advantageous in at least several respects. For example, because the polarization patterns are included in the mask designs, the single exposure or parallel fabrication process makes the throughput very high. Additionally, the photopatterning is scalable for large-scale manufacturing. By adapting step-repeat exposures, patterns with areas larger than the metamask size can be patterned. Furthermore, the transmissive metamasks function similarly as the reticles in the commercial projection photolithography systems, and thus can be directly implemented in auto steppers for wafer size manufacturing. Additionally, the systems and methods can be used for visible (e.g., G-line 436 nm) exposure or UV (e.g., I-line 365 nm) exposure. The designs of the metamasks may be slightly modified depending on the particular exposure application.

Figure 2:
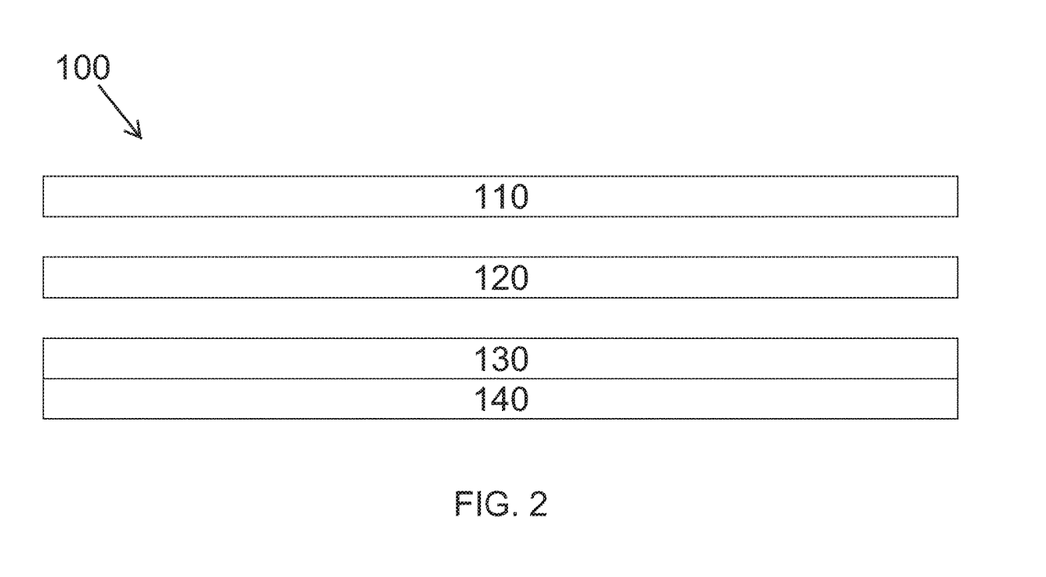
FIG. 2 is a schematic diagram illustrating a proximity photopatterning system in accordance with some embodiments of the present disclosure.

Photopatterning may be accomplished via either projection photopatterning or proximity photopatterning. A non-limiting example of a proximity photopatterning system is shown in schematic FIG. 2. The system 100 includes a light source 110, metamask 120, photoalignment material 130, and substrate 140. The distance between the metamask 120 and the photoalignment material 130 may be from about 0 to about 50 wavelengths of the light, including from about 0 to about 20 wavelengths of the light, from about 0.1 to about 10 wavelengths, and from about 0.5 to about 5 wavelengths.

Figure 3:
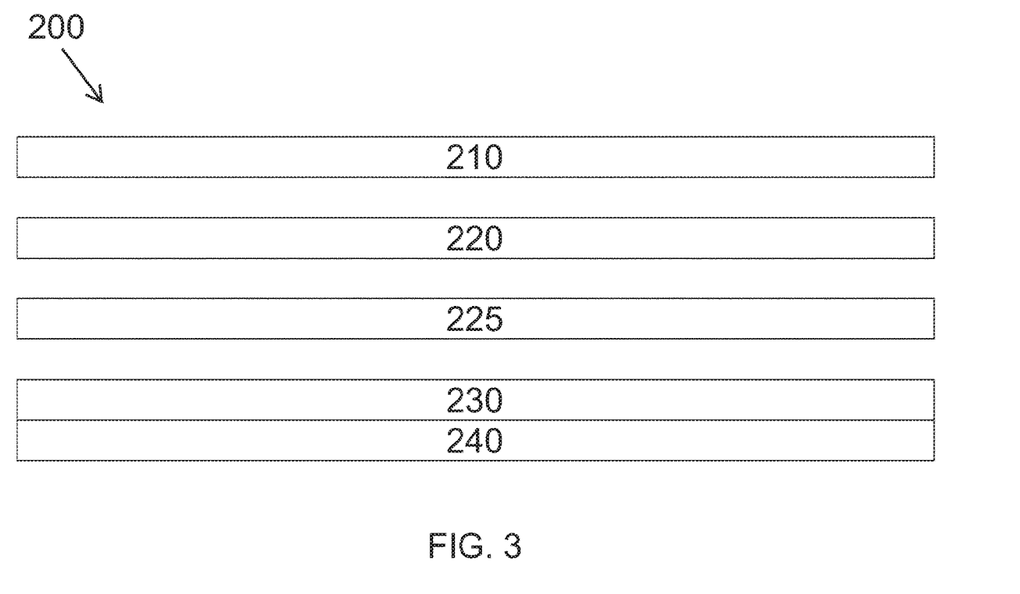
FIG. 3 is a schematic diagram illustrating a projection photopatterning system in accordance with some embodiments of the present disclosure.

A non-limiting example of a projection photopatterning system is shown in schematic FIG. 3. The system 200 includes a light source 210, metamask 220, imaging lens or lens set 225, photoalignment material 230, and substrate 240. The lens set may include two objective lenses in some embodiments.

In some embodiments, the liquid crystals are thermotropic liquid crystals, lyotropic liquid crystals, or nematic elastomers. In some embodiments, the thermotropic liquid crystals are isotropic, nematic, cholesteric (e.g., helical cholesteric), smectic phase A, or smectic phase C. In some embodiments, the lyotropic liquid crystals are cylindrical nematic liquid crystals or lamellar liquid crystals.

The concepts, systems, and methods of the present disclosure may be used with flat substrates or curved substrates. In some embodiments, the concepts, systems, and methods are used with flexible substrates.

The concepts, systems, and methods of the present disclosure may be used in the production of devices with non-uniform directors (e.g., geometric phase optical components, programmable origami, stimuli-responsive sensors, and stimuli-responsive actuators). The geometric phase optical component may be a polarization grating, a polarization conversion system, a diffractive wave plate, a waveretarder, or a beam steering device.

The following examples are provided to illustrate the devices and methods of the present disclosure. The examples are merely illustrative and are not intended to limit the disclosure to the materials, conditions, or process parameters set forth therein.

Numerical Simulations of the Plasmonic Polarization Metamasks

The systematic numerical simulations were performed using a commercial software package (CST MICROWAVE STUDIO). The CST algorithms solve the Maxwell equations using finite-integration techniques. The hexahedral mesh scheme was used with mesh sizes (≤10 nm) much smaller than the surface plasmon wavelength. The dielectric permittivity of Al was obtained by the reference. The dielectric permittivity of $SiO_2$ is fixed at 2.13 for all wavelengths. The thickness of the $SiO_2$ substrates were set as infinity, and the nanoaperture sizes and the Al film thicknesses were varied according to the designs or to the measured values of the fabricated samples. Circularly polarized plane waves, illuminated from the side of glass substrates, were used as the incident light. The electrical fields in the plane located at 500 nm above the Al mask in the air side were calculated to represent the transmitted light intensity and polarization directions.

Fabrication of the Plasmonic Polarization Metamasks

To fabricate the metamasks, a 5 nm Ti adhesion layer and a 150 nm Al film were sequentially deposited on fused quartz glass slides by e-beam evaporation. Subsequently, a 20 nm $SiO_2$ film was deposited through plasma-enhanced chemical vapor deposition (PECVD). These glass substrates were then spin-coated with 100 nm films of poly(methyl methacrylate) (PMMA) as electron beam resist. After e-beam writing and resist development, the mask patterns in PMMA were transferred into $SiO_2$ through reactive ion etching (RIE) using the recipe: 10 SCCM $C_4F_8$, 174 SCCM He, and a pressure of 4 mTorr. In the last step, the patterned $SiO_2$ layers were used as masks for etching the aluminum films using the recipe: 30 SCCM $BCl_3$, 15 SCCM $Cl_2$, and 4 SCCM $CH_4$, and a pressure of 3 mTorr.

Liquid Crystal Materials and Cells

Glass slides were cleaned with detergent in an ultrasonic bath for half an hour and then exposed to UV ozone for 10 minutes to promote the hydrophilicity. These glass slides were then spin-coated with 0.5 wt % of brilliant yellow (BY) in dimethylformamide (DMF) and baked on a 90° C. hot stage for 20 minutes. With 1500 rpm spin speed, the measured thicknesses of the coated BY films are about 8 nm. Two glass substrates with the coated surfaces inside were assembled to form a liquid crystal cell. The cell thickness was controlled using fiber spacers. The measured cell thickness was ranged between 1.7 μm and 2.5 μm.

Projection Photopatterning System

A high power lamp of X-Cite series 120 was used as the light source for illuminating the plasmonic metamasks. The light transmitted through the metamasks was collected by the imaging objective and then coupled to the back aperture of the projection objective. The projection objective focuses the mask patterns (along with their polarization fields) onto the liquid crystal cells. An optical microscope, which is made of an objective, a tube lens, and a CCD camera, was used to inspect the liquid crystal cells and mask patterns to ensure that the mask patterns are at focus in the liquid crystal cell planes and overlap with marks on the substrates. The magnification between the projected pattern and the original mask was the ratio between the nominal magnifications of the projection and imaging objectives.

Polscope

The Pol-Scope illuminates the sample with monochromatic light (λ=546 nm) and maps optical retardance Γ(x,y) and orientation of the slow axis of birefringence. For 5CB, the slow axis represents the long axis of 5CB molecules.

Example 1

Systematic computer simulations were carried out and yielded the following device guidance: (1) triangular lattices give rise to higher optical transmission that square lattices due to a higher packing fraction; (2) smaller film thicknesses yield higher transmittance but lower polarization contrast; (3) reduced lattice spacing leads to an increase in optical transmission; and (4) complex polarization fields can be generated in the transmitted light when the nanoaperture arrays are arranged in non-uniform orientations.

The calculated transmission spectra under normal incidence were generally composed of two overlapping peaks. The right peak at the longer wavelength is sensitive to variations in the nanoaperture shape and size. At the peak wavelength, the electrical field inside the nanoaperture is primarily perpendicular to the long axis with a bell-shaped distribution along the long axis, suggesting TM and TE waveguide modes in the short and long axes, respectively. The right peak can thus be attributed to a resonance of coupled cavities. The second peak at shorter wavelengths (<500 nm) is only sensitive to the variations of the periodicity. Its peak wavelength agrees with the excitation wavelength of the surface plasmon waves at the Al-substrate interface, suggesting the short wavelength peak results from the surface plasmon enhanced transmission.

Example 2

Triangular lattices of parallel rectangular nanoapertures were produced in 150 nm-thick aluminum films. Metamasks having four different periodicities (270 nm, 300 nm, 330 nm, and 360 nm) were produced. The average sizes of the nanoapertures were about 100 nm×about 250 nm. The measured transmissions spectra for polarization perpendicular to the long axis exhibit broadband peaks with the transmittance increasing as the periodicity is reduced. The measured transmission for polarization parallel to the nanoapertures long axis is less than 5%, indication a >5 dB polarization contrast. A condenser was used for illumination and to mimic the mask condition. Therefore, the measured transmission bandwidths are larger than the simulation results based on normal illumination.

Example 3

Figure 4:
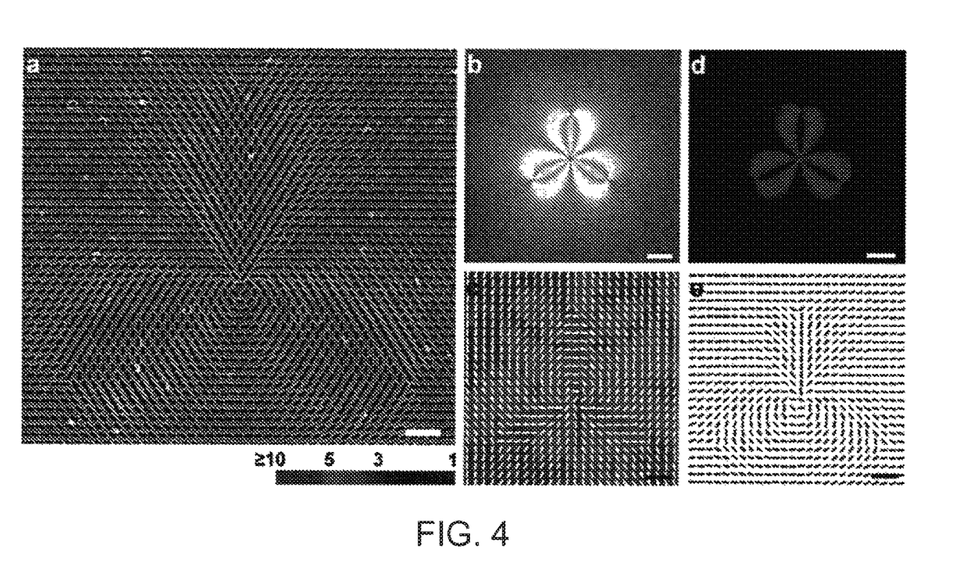
FIG. 4a is an SEM image of a plasmonic metamask as described in Example 3.
FIG. 4b is a transmission optical image as described in Example 3.
FIG. 4c illustrates the measured polarization field as described in Example 3.
FIG. 4d is a cross-polarized optical microscope image as described in Example 3.
FIG. 4e shows the Pol-Scope measured molecular orientation field as described in Example 3.

As a proof-of-capability for arbitrary designer patterns, plasmonic metamasks were designed for clusters and arrays of topological defects in a nematic liquid crystal. The topological defects were used for two reasons. First, they are accompanied by strong gradients of the director fields and thus allow testing of the spatial scale limits of the pattern design. Second, the topological defects in nematic liquid crystals are central elements of numerous applications, such as directed colloidal assembly, electrokinetic motion, and programmable origami. Two-dimensional director fields of a nematic liquid crystal satisfy the Laplace equation under single elastic constant approximation. For single topological defects, the director orientation angle ψ can be expressed as a linear function of the azimuthal angle φ:

$$\psi = k\varphi + \psi_0$$

wherein k represents the defect strength or charge. Based on this equation and the principle of superposition, the nanoaperture orientations at position (x,y) in the metamasks for the defect clusters were set as $$\psi = \sum_i k_i \tan^{-1}\left(\frac{y - y_{i0}}{x - x_{i0}}\right) + \psi_{i0}$$

wherein $k_i$, $\psi_{i0}$, $x_{i0}$, and $y_{i0}$ are, respectively, the charge, initial angle, x and y coordinates of the i-th defect. FIG. 4 is an SEM image of a plasmonic metamask with a cluster of 4 topological defects. In FIG. 4a, $k_i$=1.5, $\psi_{i0}$=0, $k_i$=−0.5, and $\psi_{i0}$=0 where i=2-4.

FIG. 4b is a transmission optical image of the plasmonic metamask under illumination of non-polarized white light. Spatial non-uniformity can be seen in the optical transmission, which can be attributed to the complex interferences of the light emerging from individual apertures. While this spatial non-uniformity inevitably causes variations in the threshold exposure time in photoalignment, its impact on alignment patterning can be circumvented by over-exposing these high-transmission regions.

FIG. 4c shows the measured polarization field for the plasmonic metamask wherein the background color represents polarization contrast as indicated by the colored sidebar. Local polarization directions are perpendicular to the average orientations of the nanoapertures in the metamask, which is in agreement with simulations. Generally, areas with parallel nanoapertures provide higher polarization contrasts than areas with non-uniform nanoaperture orientations, and the polarization contrasts are ranged between about 3 and about 10.

The non-uniformity in optical transmission can be attributed to minor orientation dependence of the nanoaperture size introduced in the mask fabrication processes and to the non-uniform polarization patterns. The azimuthally variant polarization directions generate optical vortexes, leading to non-uniform intensity distribution. For example, the dark spots at the defect centers in FIG. 4b are a characteristic feature of optical vortexes.

Figure 5:
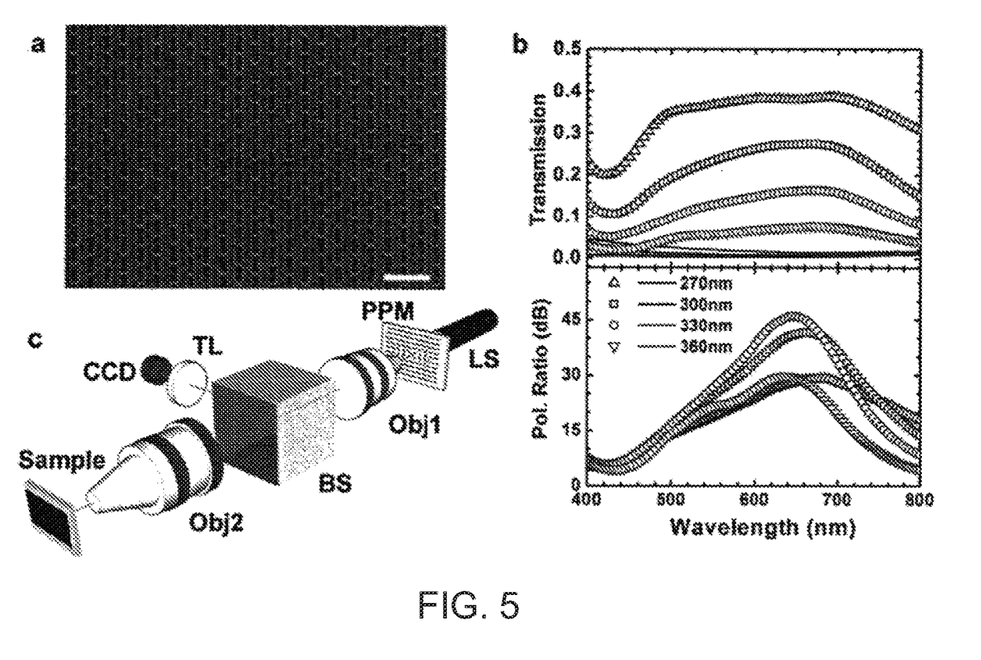
FIG. 5a is an SEM image of a parallel nanoaperture array with 270 nm periodicity.
FIG. 5b is a graph showing the measured transmission spectra and polarization ratio for parallel aperture arrays with different periodicities.
FIG. 5c schematically illustrates a photopatterning system that may be used in accordance with some embodiments of the methods of the present disclosure.

FIG. 5a is a SEM image of a parallel nanoaperture array with 270 nm periodicity. FIG. 5b is a graph showing the measured transmission spectra and polarization ratio for parallel aperture arrays with different periodicities. FIG. 5c schematically illustrates a photopatterning system that may be used in some embodiments of the present disclosure wherein Obj1 is an imaging objective, Obj2 is a projection objective, LS is a light source, TL is a tube lens, and BS is a beam splitter. The scale bar in FIG. 5a is 1 μm.

The projection system can be used to image the transmitted light of the metamasks onto liquid crystal cells in which the surfaces are coated with films of photoalignment materials (e.g., ~8 nm thick films). When the cell thickness is within the field depth of the objectives, the top and bottom substrates can be exposed simultaneously. Depending on the numerical aperture (NA) of the objectives, the field depth, approximated as $\lambda/NA^2$, can range from 2 μm (0.5 NA) to 10 μm (0.2 NA).

The exposed cells are then filled with nematic liquid crystal material 4-cyano-4'-pentylbiphenyl (5CB). Intriguing schlieren textures can be observed in these photopatterned liquid crystal cells with a cross-polarized optical microscope.

FIG. 4d is a cross-polarized optical microscope image of the 4 defects patterned with the mask and shows the flower texture of one +1.5 and three −0.5 defects. Around individual defect centers are black brushes where the liquid crystal molecular directors are parallel to either the polarizer or the analyzer. The number $n_b$ of brushes represents the absolute charge of the defect: $|k|=n_b/4$.

FIG. 4e shows the Pol-Scope measured molecular orientation field. A comparison between the liquid crystal director pattern and the metamask shows that the photo patterned liquid crystal directors follow the nanoaperture orientations in the plasmonic metamask. Similar results are obtained for +0.5/−0.5 defect pair, a cluster of +1/−0.5/−0.5 defects, and a cluster of one +2 and four −0.5 defects. This makes the metamask design straightforward: use the target molecular director patterns as the orientations for the nanoapertures. This simple design rule relies on the photo-induced isomerization of azo-dyes which transform from anisotropic trans state to isotropic cis state. Since this process requires an electrical field along the dipoles or the long axis of azo molecules, these trans molecules oriented perpendicularly to the light polarization will remain unaffected upon optical excitation. Therefore, the exposed photoalignment materials become anisotropic with an average molecular long axis perpendicular to the optical polarization.

The scale bars in FIG. 4a-e are 1 µm, 10 µm, 5 µm, 25 µm, and 15 µm, respectively.

Example 4

Metamasks for periodic arrays of topological defects were designed by tiling square patches of individual defects. The results are shown in FIG. 6a-j.

Figure 6:
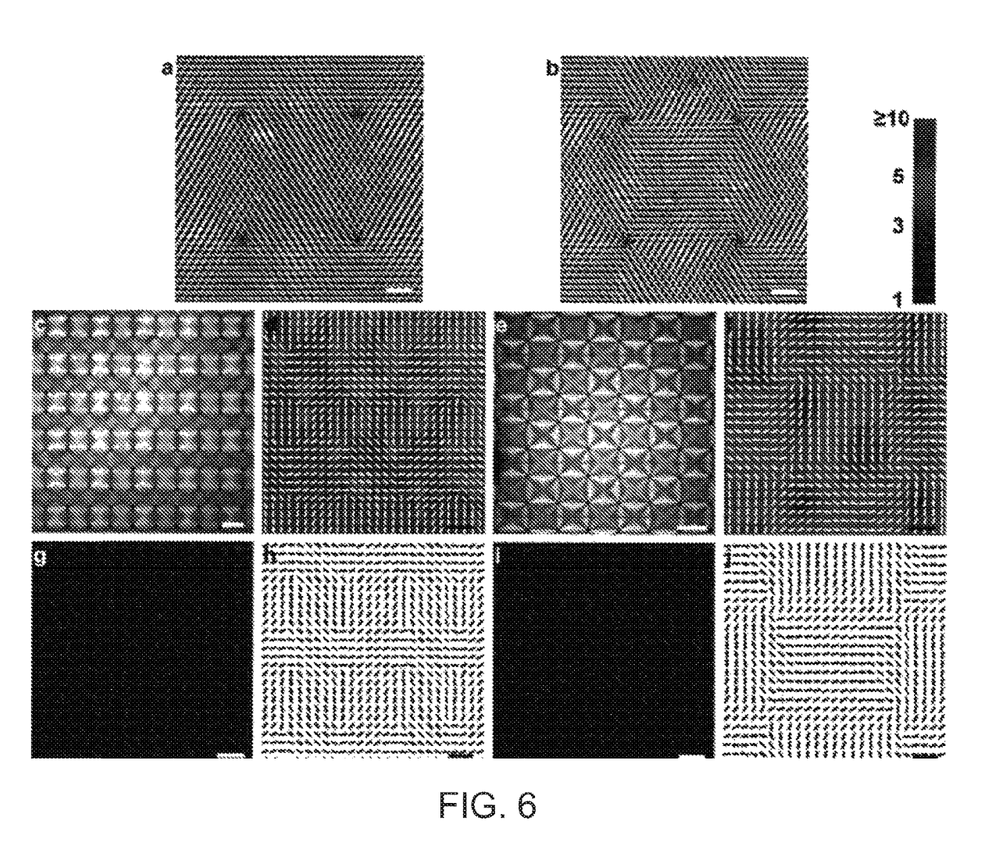

FIGS. 6a and b are SEM images of illustrative plasmonic metamasks for +0.5/−0.5 and +1/−1 topological defect arrays. Each unit cell is composed of two positive defects and two negative defects with the same absolute charges. FIG. 6c-f present optical characterizations of the metamasks for the defect arrays. The measured polarizations of the transmitted light are perpendicular locally to the nanoaperture long axes. Transmission optical images of the plasmonic metamasks under illumination of non-polarized white light are shown in FIGS. 6c and e. Measured polarization fields for the plasmonic metamasks are shown in FIGS. 6d and f wherein the background color represents polarization contrast as indicated by the colored scale bar. Cross-polarized optical microscope images of the liquid crystal textures patterned with the masks are shown in FIGS. 6g and i. The liquid crystal director fields were measured by a Pol-Scope and are shown in FIGS. 6h and j. The scale bars represent 1 µm in FIGS. 6a and b; 2.5 µm in FIG. 6d, f, h, and j; 5 µm in FIG. 6c; 10 µm in FIGS. 6e and g; and 25 µm in FIG. 6i.

To illustrate high spatial resolution that can be achieved with the disclosed systems and methods, arrays of +0.5 and −0.5 defects were patterned using a 50×0.55NA image objective and a 40×0.6NA projection objective. The microscope textures and the measured director field in FIGS. 6g and h demonstrate that 4.5 µm spacing between the defects is successfully achieved. Given that the diameter of the diffracted Airy disk (1.22λ/NA) is about 1 µm for λ=450 nm wavelength, the 4.5 µm defect spacing is approaching the diffraction limit of the system.

Example 5

Figure 7:
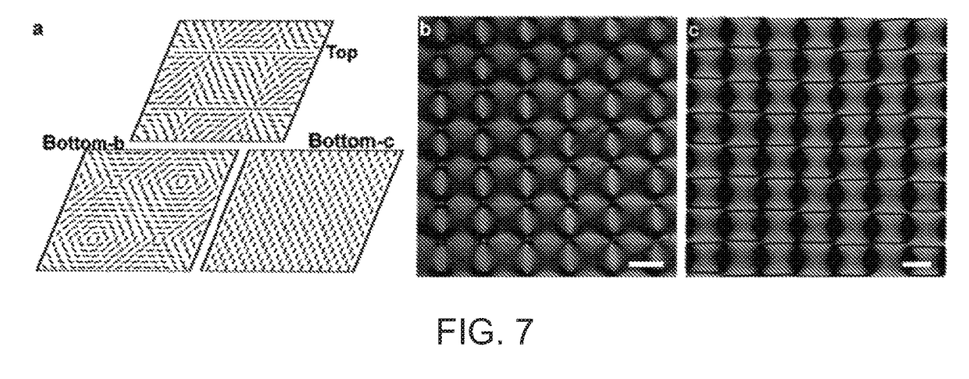

Some systems of the present disclosure are also capable of aligning different director patterns at the top and bottom surfaces, which are required by many applications. First, marks are fabricated on the top and bottom substrates and coated with photoalignment materials. After exposing patterns at predesigned positions on top and bottom substrates, liquid crystal cells can be assembled with the marks on the top and bottom substrates aligned. FIG. 7 presents two exemplary cases where both have the same top pattern of +1/−1 defect array with $\psi_0=0$, while one bottom pattern is the +1/−1 defect array with $\psi_0=\pi/2$ and the other is a uniform alignment. FIG. 7a schematically illustrates the patterns. The top pattern was the same of b and c. In b, the bottom pattern was arrays of +1 and −1 defects. In c, a uniform vertical alignment was used for the bottom pattern. FIGS. 7b and c are cross-polarized optical microscope images of liquid crystal textures with a different defect array on the bottom (b) and a uniform director at the bottom (c). The scale bars in FIGS. 7b and c are 200 µm and 20 µm, respectively. For the case where the defects of the same charge are shifted by one lattice spacing, the microscopic textures under cross-polarized microscopy show black lines connecting nearest defect centers (FIG. 7b). This can be understood by considering that going into the third dimension, the +1 (or −1) defects split into two +0.5 (or −0.5) defect lines which end up in the nearest lattice site on the opposite substrate. For the second case, defect lines connecting neighboring defect sites in the horizontal direction can be seen (FIG. 7c).

Example 6

Figure 8:
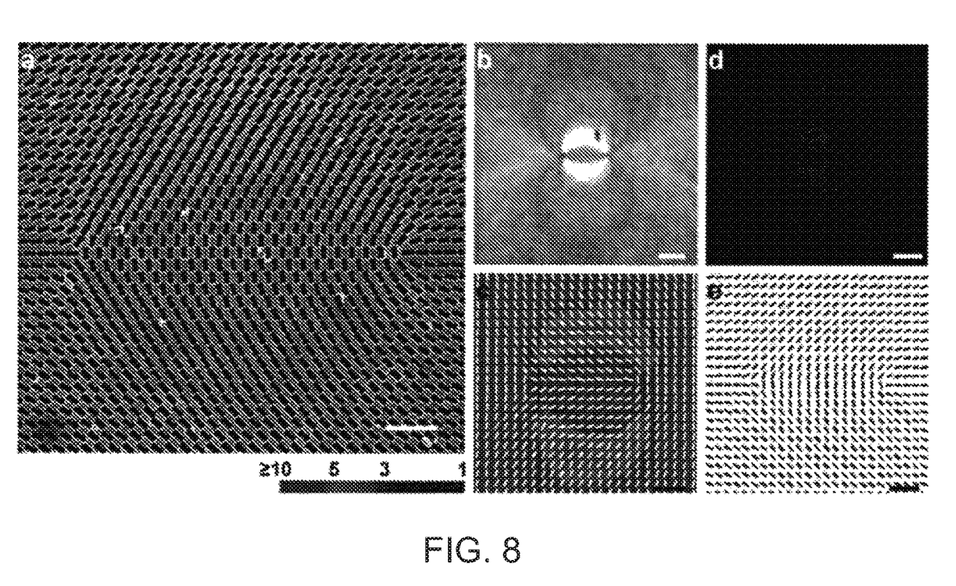
FIG. 8a is a SEM image of a plasmonic metamask as described in Example 6.
FIG. 8b is a transmission optical image as described in Example 6.
FIG. 8c illustrates the measured polarization field as described in Example 6.
FIG. 8d is a cross-polarized optical microscope image as described in Example 6.
FIG. 8e is a Pol-Scope of the measured molecular orientation field as described in Example 6.

A plasmonic metamask having patterning including two defect pairs of +0.5 and −0.5 charges was produced. FIG. 8a is a SEM image of the plasmonic metamask. For imaging clarity, the defect spacing is reduced in comparison to the real metamask shown in FIG. 8b. FIG. 8b is a transmission optical image of the plasmonic metamask under illumination of non-polarized white light. FIG. 8c illustrates the measured polarization field for the plasmonic metamask where the background color represents polarization contrast as indicated by the scale bar. FIG. 8d is a cross-polarized optical microscope image of the defects patterned with the mask. FIG. 8e is a Pol-Scope of the measured molecular orientation field. The scale bars in FIG. 8a through e are 1 µm, 2 µm, 2.5 µm, 20 µm, and 5 µm, respectively.

Example 7

Figure 9:
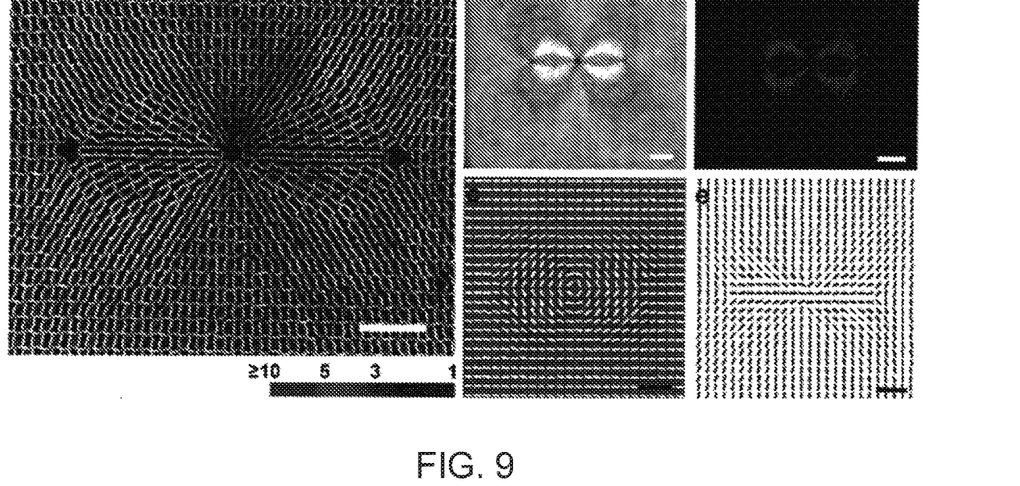
FIG. 9a is a SEM image of a plasmonic metamask as described in Example 7.
FIG. 9b is a transmission optical image as described in Example 7.
FIG. 9c illustrates the measured polarization field as described in Example 7.
FIG. 9d is a cross-polarized optical microscope image as described in Example 7.
FIG. 9e is a Pol-Scope of the measured molecular orientation field as described in Example 7.

A plasmonic metamask having patterning including one +1 defect and two −0.5 defects was produced. FIG. 9a is a SEM image of the plasmonic metamask. For imaging clarity, the defect spacing is reduced in comparison to the real metamask observed in FIG. 9b. FIG. 9b is a transmission optical image of the plasmonic metamask under illumination of non-polarized white light. FIG. 9c illustrates the measured polarization field for the plasmonic metamask where the background color represents polarization contrast as indicated by the scale bar. FIG. 9d is a cross-polarized optical microscope image of the defects patterned with the mask. FIG. 9e is a Pol-Scope of the measured molecular orientation field. The scale bars in FIG. 9a through e are 1 µm, 5 µm, 5 µm, 15 µm, and 10 µm, respectively Example 8

Figure 10:
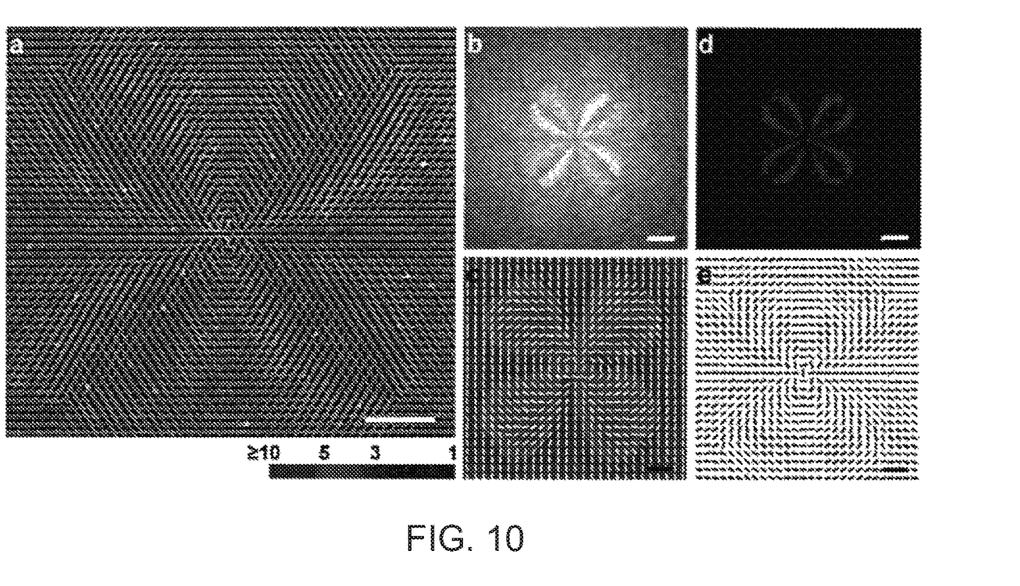
FIG. 10a is a SEM image of a plasmonic metamask as described in Example 8.
FIG. 10b is a transmission optical image as described in Example 8.
FIG. 10c illustrates the measured polarization field as described in Example 8.
FIG. 10d is a cross-polarized optical microscope image as described in Example 8.
FIG. 10e is a Pol-Scope of the measured molecular orientation field as described in Example 8.

A plasmonic metamask having patterning including one +1 defect and four −0.5 defects was produced. FIG. 10a is a SEM image of the plasmonic metamask. For imaging clarity, the defect spacing is reduced in comparison to the real made in FIG. 10b. FIG. 10b is a transmission optical image of the plasmonic metamask under illumination of non-polarized white light. FIG. 10c illustrates the measured polarization field for the plasmonic metamask where the background color represents polarization contrast as indicated by the scale bar. FIG. 10d is a cross-polarized optical microscope image of the defects patterned with the mask. FIG. 10e is a Pol-Scope of the measured molecular orientation field. The scale bars in FIG. 10a through e are 2 µm, 10 µm, 5 µm, 25 µm, and 10 µm, respectively Example 9

Figure 11:
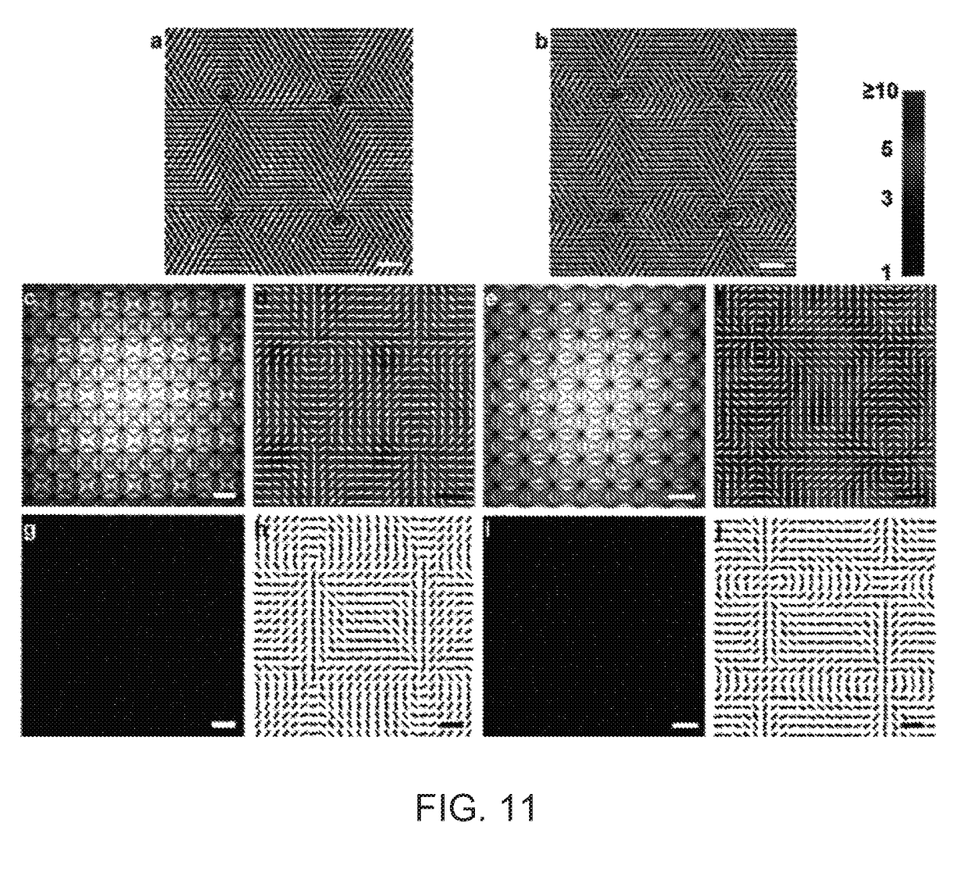

Plasmonic metamasks having photopatterning defect arrays of +1.5/−1.5 charges and +2/−2 were produced. FIGS. 11a and b are SEM images of the plasmonic metamasks having defect arrays of +1.5/−1.5 and +2/−2, respectively. For imaging clarity, the defect spacing is reduced in comparison to the real made in FIGS. 11c and e. FIGS. 11c and e are transmission optical images of the plasmonic metamask under illumination of non-polarized white light. FIGS. 11d and f illustrate the measured polarization field for the plasmonic metamasks where the background color represents polarization contrast as indicated by the scale bars. FIGS. 11g and i are cross-polarized optical microscope images of the defects patterned with the masks. FIGS. 11g and i is a Pol-Scope of the measured molecular orientation field. The scale bars represent 1 µm in FIGS. 11a and b; 2.5 µm in FIG. 11d, f, h, and j; 5 µm in FIG. 11c; 10 µm in FIGS. 11e and g; and 25 µm in FIG. 11i.

Example 10

Cholesteric liquid crystal cells were photopatterned. The cells were 4 urn thick. Brilliant yellow was used as the photoalignment material. The cholesteric liquid used was 5CB doped with 7 wt % CB15 ((S)-4-cyano-4'-(2-methylbutyl)biphenyl) at 25° C. The cholesteric pitch was 2 µm.

Example 11

Figure 12:
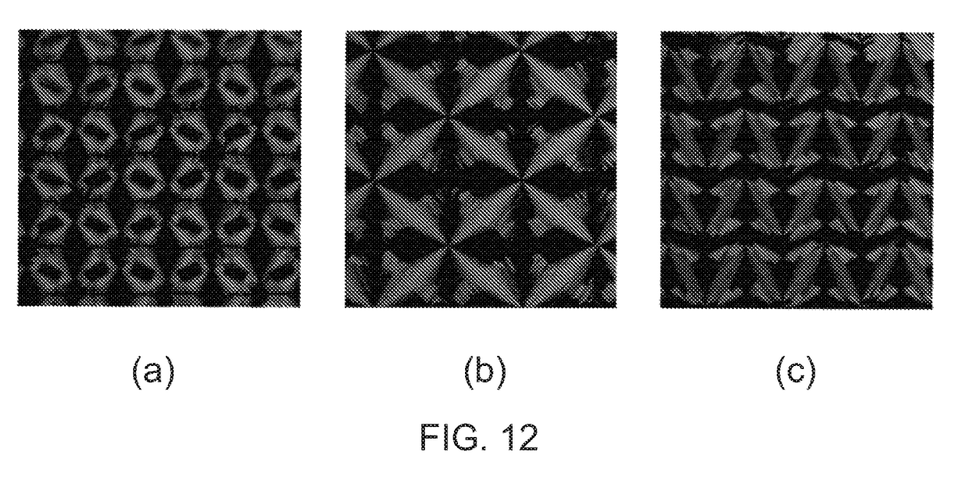
FIG. 12a-c are optical images for various patterns as described in Example 11.

Smectic (SmA phase) liquid crystal cells were photopatterned. The cells had a 8 µm thickness with inner surfaces coated with alignment materials photopatterned with plasmonic metamasks. The photoalignment material was brilliant yellow and the smectic liquid crystal was CCN47 (4'trans-butyl-4-cyano-4-trans-heptyl-1,1'-bicyclohexane) at 25° C. FIG. 12a-c are optical images for a sinusoidal function pattern, a +1/−1 defect array pattern, and a +0.5/−0.5 defect array pattern, respectively.

Example 12

The photoalignments of lyotropic liquid crystals was enhanced by using the following process. The photosensitive material Brilliant Yellow (BY) was mixed with N,N-Dimethylformamide (DMF) solvent at 0.3 wt % concentration. The BY solution was spin-coated on the glass substrates at 3000 rpm for 30 s. The glass plates were baked at 95° C. for 30 min, and exposure with the projection photo-patterning system. Then a toluene solution of monomer RM257 (4-(3-Acryloyloxypropyloxy)-benzoesure 2-methyl-1,4-phenylester, from Merck) and Irgacure 651 (2,2-Dimethoxy-1,2-diphenylethan-1-one, from Ciba) was prepared with a 10 wt % of RM257 and 0.05 wt % of Irgacure 651. The solution was spin coated onto the exposed substrates at 3000 rpm for 30 s. The substrates were baked at 55° C. for 5 min to evaporate the solvent and then photo-polymerized for 30 min. Since the polymer covering the patterns is birefringent, the exposed director patterns were visible under the microscope. Two substrates were assembled together with the cell gap set by 5 µm glass spacers. The cell was filled with disodium cromoglycate (DSCG) solution and sealed promptly by an epoxy glue. The sealed cell was heated up to isotropic phase to eliminate all the flow alignment and cooled to the 25° C. at which the DSCG is in nematic phase.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:
1. A method for aligning liquid crystals comprising:
transmitting light through or reflecting light by a metamask onto a substrate, wherein the metamask generates light with spatially variant patterns of polarization direction and intensity;
wherein the substrate comprises the liquid crystals.
2. The method of claim 1, wherein the liquid crystals are in contact with photoalignment materials during and/or after the transmitting.
3. The method of claim 1, wherein the metamask is a plasmonic metamask.
4. The method of claim 1, wherein the light transmitted through or reflected by the metamask has patterns of spatial variations in intensity and polarization direction.
5. The method of claim 1, wherein the metamask comprises metallic nanostructures.
6. The method of claim 5, wherein the metamask comprises a perforated metal sheet.
7. The method of claim 6, wherein the perforated metal sheet has a thickness of from about 50 nm to about 500 nm.
8. The method of claim 6, wherein the perforated metal sheet comprises rectangular apertures having a width of from about 40 nm to about 200 nm and a length of from about 100 nm to about 400 nm.
9. The method of claim 6, wherein the perforated metal sheet comprises apertures whose centers are arranged in a triangular lattice.
10. The method of claim 9, wherein the lattice has a periodicity of from about 100 to about 500 nm.
11. The method of claim 9, wherein the apertures are arranged with spatially varying orientations.
12. The method of claim 6, wherein the metamask comprises a metal film having nanoscale slits.
13. The method of claim 12, wherein a wavelength of light provided to the metamask is greater than at least one of a width of the nanoscale slits and a spacing between adjacent nanoscale slits.
14. The method of claim 12, wherein orientations of the nanoscale slits are varied spatially.
15. The method of claim 6, wherein the metamask comprises anisotropic nanoparticles.
16. The method of claim 1, wherein a photoalignment layer is present on a top surface of the substrate during the transmitting.
17. The method of claim 1, wherein the substrate further comprises a photoalignment material mixed with the liquid crystals.
18. A method for aligning liquid crystals comprising:
transmitting light through or reflecting light by a metamask onto a substrate, wherein the metamask generates light with spatially variant patterns of polarization direction and intensity;
wherein the substrate comprises the liquid crystals;
wherein a photoalignment layer is present on a top surface of the substrate during the transmitting; and
wherein the metamask is located at a distance of from about 0 to about 50 times a wavelength of light provided to the metamask.
19. The method of claim 16, wherein a lens is positioned between the metamask and the photoalignment layer for projecting the metamask patterns onto the substrate.

20. A method for aligning liquid crystals comprising:
transmitting light through or reflecting light by a metamask onto a substrate, wherein the metamask generates light with spatially variant patterns of polarization direction and intensity;
wherein the substrate comprises the liquid crystals;
wherein a photoalignment layer is present on a top surface of the substrate during the transmitting; and
wherein two objective lenses are positioned between the metamask and the photoalignment layer for projecting the metamask patterns onto the substrate.

* * * * *

UNITED STATES PATENT AND TRADEMARK OFFICE
CERTIFICATE OF CORRECTION

PATENT NO.          : 12,044,933 B2
APPLICATION NO.     : 15/750847
DATED               : July 23, 2024
INVENTOR(S)         : Qi-Huo Wei et al.

Page 1 of 1

It is certified that error appears in the above-identified patent and that said Letters Patent is hereby corrected as shown below:

On the Title Page

Item (54), and in the Specification, Column 1, Lines 1-2, the Title, should be corrected to read as follows:
SYSTEM AND METHOD OF PHOTOPATTERNING OF MOLECULAR ORIENTATIONS USING METAMASK Signed and Sealed this
Twenty-sixth Day of November, 2024

Katherine Kelly Vidal
*Director of the United States Patent and Trademark Office*